(12) United States Patent
Wurm

(10) Patent No.: US 8,148,821 B2
(45) Date of Patent: Apr. 3, 2012

(54) DENSE SEED LAYER AND METHOD OF FORMATION

(75) Inventor: Stefan Wurm, Austin, TX (US)

(73) Assignee: Infineon Technologies AG, Munich (DE)

( * ) Notice: Subject to any disclaimer, the term of this patent is extended or adjusted under 35 U.S.C. 154(b) by 463 days.

(21) Appl. No.: 12/467,065

(22) Filed: May 15, 2009

(65) Prior Publication Data

US 2009/0224406 A1 Sep. 10, 2009

Related U.S. Application Data

(62) Division of application No. 11/865,886, filed on Oct. 2, 2007, now Pat. No. 7,576,005, which is a division of application No. 10/980,561, filed on Nov. 3, 2004, now Pat. No. 7,294,851.

(51) Int. Cl.
*H01L 21/00* (2006.01)

(52) U.S. Cl. .................. 257/762; 257/412; 257/43

(58) Field of Classification Search ............... 257/762, 257/412, 43
See application file for complete search history.

(56) References Cited

U.S. PATENT DOCUMENTS

| | | | |
|---|---|---|---|
| 3,935,333 A | | 1/1976 | Muneoka et al. |
| 3,979,271 A * | | 9/1976 | Noreika et al. ........... 204/192.25 |
| 4,213,781 A * | | 7/1980 | Noreika et al. ............... 420/528 |
| 5,146,465 A | | 9/1992 | Khan et al. |
| 6,399,489 B1 * | | 6/2002 | M'Saad et al. ................ 438/680 |
| 6,486,061 B1 * | | 11/2002 | Xia et al. ....................... 438/680 |
| 6,713,390 B2 * | | 3/2004 | M'Saad et al. ................ 438/680 |
| 6,803,325 B2 * | | 10/2004 | M'Saad et al. ................ 438/762 |
| 7,279,421 B2 * | | 10/2007 | Suzuki ........................... 438/680 |
| 7,294,851 B2 * | | 11/2007 | Wurm .............................. 257/43 |
| 7,338,901 B2 * | | 3/2008 | Ishizaka ........................ 438/680 |
| 7,344,982 B2 * | | 3/2008 | Goswami et al. ............. 438/680 |
| 7,396,766 B2 * | | 7/2008 | Suzuki ........................... 438/680 |
| 7,407,876 B2 * | | 8/2008 | Ishizaka ........................ 438/597 |
| 7,498,242 B2 * | | 3/2009 | Kumar et al. ................. 438/474 |
| 7,534,967 B2 * | | 5/2009 | Kelber et al. ................. 174/263 |
| 7,576,005 B2 * | | 8/2009 | Wurm ........................... 438/680 |
| 7,961,393 B2 * | | 6/2011 | Perkins et al. ........... 359/485.05 |
| 8,027,087 B2 * | | 9/2011 | Perkins et al. ........... 359/485.05 |
| 2001/0038255 A1 | | 11/2001 | Wadaka et al. |
| 2003/0032282 A1 * | | 2/2003 | M'Saad et al. ................ 438/680 |

(Continued)

OTHER PUBLICATIONS

Lide, D. R., CRC Handbook of Chemistry and Physics, 73$^{rd}$ Ed., Sep. 23, 1992, p. 12-79.

(Continued)

*Primary Examiner* — Laura Menz

(74) *Attorney, Agent, or Firm* — Slater & Matsil, L.L.P.

(57) ABSTRACT

Methods of forming dense seed layers and structures thereof are provided. Seed layers including a monolayer of molecules having a density of about 0.5 or greater may be manufactured over a metal layer, resulting in a well-defined interface region between the metal layer and a subsequently formed material layer. A seed layer including a monolayer of atoms is formed over the metal layer, the temperature of the workpiece is lowered, and a physisorbed layer is formed over the seed layer, the physisorbed layer including a weakly bound layer of first molecules. A portion of the first molecules in the physisorbed layer are dissociated by irradiating the physisorbed layer with energy, the dissociated atoms of the first molecules being proximate the seed layer. The workpiece is then heated, causing integration of the dissociated atoms of the first molecules of the physisorbed layer into the seed layer and removing the physisorbed layer.

11 Claims, 4 Drawing Sheets

U.S. PATENT DOCUMENTS

| | | | |
|---|---|---|---|
| 2004/0087143 A1 | 5/2004 | Norman et al. | |
| 2004/0166658 A1* | 8/2004 | Kelber et al. | 438/597 |
| 2006/0094239 A1* | 5/2006 | Wurm | 438/680 |
| 2006/0211243 A1* | 9/2006 | Ishizaka et al. | 438/680 |
| 2006/0216932 A1* | 9/2006 | Kumar et al. | 438/641 |
| 2006/0223310 A1* | 10/2006 | Suzuki | 438/652 |
| 2006/0267019 A1* | 11/2006 | Kim et al. | 257/68 |
| 2008/0020571 A1* | 1/2008 | Wurm | 438/680 |
| 2008/0038920 A1* | 2/2008 | Goswami et al. | 438/680 |
| 2008/0171435 A1* | 7/2008 | Fujii et al. | 438/680 |
| 2008/0194103 A1* | 8/2008 | Wagner | 438/680 |
| 2008/0213999 A1* | 9/2008 | Wagner | 438/660 |
| 2008/0261398 A1* | 10/2008 | Sakata et al. | 438/680 |
| 2009/0224406 A1* | 9/2009 | Wurm | 257/762 |

OTHER PUBLICATIONS

Schlichting, H., "Methoden und Mechanismen der thermischen Desorption: Adsorptions-, Desorptions-Kinetik, Epitaxie und Ordnung von Edelgasschichten auf Ru(001)," Dissertation, Aug. 31, 1990, pp. i-iii and 88-94, Technische Universität München Fdkultät für Physik, München, Germany.

\* cited by examiner

DENSE SEED LAYER AND METHOD OF FORMATION

This application is a divisional of patent application number 11/865,886, entitled "Dense Seed Layer and Method of Formation," filed on Oct. 2, 2007, now U.S. Pat. No. 7,756,005 which is a divisional of patent application serial number 10/980,561, entitled "Dense Seed Layer and Method of Formation," filed on Nov. 3, 2004 and issued on Nov. 13, 2007 as U.S. Pat. No. 7,294,851, which application is incorporated herein by reference.

TECHNICAL FIELD

The present invention relates generally to the fabrication of semiconductors, and more particularly to methods of forming seed layers of semiconductor devices.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

With the semiconductor industry targeting smaller feature sizes, the interface regions between two adjacent thin films, and the surface properties of thin films, have become more important to device performance. The definition of an interface region between two films in terms of the thickness of the interface region, i.e., the number of atomic layers or molecular layers the interface region comprises, has become more critical as semiconductor devices are scaled down in size. In addition, there are limitations to the maximum temperatures allowed in thin film deposition processes because of device performance degradation.

In order to improve the interface region between two adjacent thin films, seed layers are often used. FIG. 1 shows a cross-sectional view of a prior art semiconductor device 100 comprising a workpiece 102. The workpiece 102 may comprise a semiconductor wafer, and may include a variety of material layers formed thereon, for example, metal layers, semiconducting layers, dielectric layers, diffusion barrier layers, etc., not shown. A first material layer comprising a metal layer 104 is formed over the workpiece 102, as shown. The metal layer 104 may comprise a gate of a transistor, a plate of a capacitor, a conductive line, or other electrical components or portions of electrical components of an integrated circuit, for example.

In many semiconductor designs, it is desirable to form a second material layer comprising an insulating or semiconductor material layer 114 over the metal layer 104. During the formation of the second material layer 114, an interface region 112 can form between the metal layer 104 and the insulating or semiconductor material layer 114, often comprising material of both the metal layer and the insulating or semiconductor material layer 114, for example. In some applications, this is undesirable, because the interface region 112 has a detrimental impact on the performance of the semiconductor device 100. It is the goal in many semiconductor designs to form an insulating or semiconductor material layer 114 directly abutting the metal layer 104, so that the bulk properties of the insulating or semiconductor material layer 114 and the metal layer 104 are achieved. Thus, often a seed layer 110 is formed on the metal layer 114 before depositing the material layer 114, as shown, to decrease the interface region 112 thickness.

One method of forming the seed layer 110 is by forming a monolayer of the atoms 108 of a desired species by chemisorption. Chemisorption is a process whereby an atom or molecule adheres to a surface through the formation of a chemical bond, rather than by physisorption. In physisorption, an atom or molecule adheres to a surface by a van der Waals type force or electrostatic attraction rather than by a chemical bond. Generally, chemisorption produces stronger bonds than physisorption.

A problem with forming a seed layer 110 comprising a monolayer of atoms 108 is that there is a limitation on the number of atoms 108 that may be formed on the top surface of the metal layer 104. This is because many of the atomic species that are important in semiconductor manufacturing absorb from the gas phase onto a metal surface by dissociative adsorption. In this process of dissociative adsorption, the first step is the adsorption of the molecule (like $O_2$ or $N_2$) on the surface of metal layer 104, and the second step is the dissociation of the molecule with each of the atoms 108 now being bound individually to the surface of metal layer 104. After a sufficient number of atoms 108 is adsorbed on the surface of metal layer 104 it becomes impossible for additional molecules from the gas phase to get close enough to the metal surface 104 to start the dissociative adsorption process, and the molecules bounce back from the surface. After access to the metal layer 104 surface is blocked in this way, the saturation coverage for the atomic/molecular species (e.g., of atoms 108) is reached. Typically the saturation coverage is well below one monolayer, i.e., where there would be a 1:1 relationship between atoms 106 and 108. For example, an ideal monolayer would have for each metal atom 106 in the metal layer 104 surface, one oxygen or nitrogen atom 108 adsorbed on the metal layer 104 surface.

However, a 1:1 monolayer is not actually formed; typical saturation coverages are well below 0.4 and often not more than 0.25 monolayer, which occurs because of a limited number of adsorption sites. The metal layer 104 has a number of atoms 106 disposed at the top surface. The atoms 106 at the top surface of the metal layer 104 have a fixed number of adsorption sites that may be occupied if adsorption of atoms 108 of the seed layer 110 proceeds via dissociative adsorption of molecules out of a gas phase, which is typically the process used to form the seed layer 110. For example, if the metal layer 104 comprises ruthenium (Ru) with crystal orientation 001, i.e., Ru (001), and atomic oxygen is the species to be formed as a seed on the metal layer 104, a seed layer 110 of a monolayer of oxygen atoms 108 having a density of 0.25 or less is achieved when the seed layer 110 is formed at room temperature by adsorption from a gas phase of molecular oxygen. In particular, in this example, there may be one oxygen atom 108 in the monolayer seed layer 110 for every four atoms 106 of the metal element of the material layer 104, as shown, resulting in a 1:4 ratio of the seed layer 110 atoms to the metal layer 104 atoms, or a seed layer 110 having density of 0.25 or less with respect to the density of the metal layer 104.

When the next material layer 114 is deposited, an interface region 112 is formed, comprising a thickness $d_1$ of about 10 to 15 atomic layers. It is desirable for the interface region 112 to be as thin as possible, or more preferably, for no interface region 112 to form, in some applications.

What is needed in the art is a method of forming a material layer 114 over a metal layer 104 that results in the formation of a thinner interface region 112 between the material layer 114 and the metal layer 104. A well-defined interface between a metal layer 104 and a subsequently deposited material layer 114 is needed.

What is also needed in the art are improved methods of forming seed layers, in order to overcome the current limitations of interface and thin film engineering, and the limitations of kinetics of interface formation and thin film growth.

SUMMARY OF THE INVENTION

These and other problems are generally solved or circumvented, and technical advantages are generally achieved, by preferred embodiments of the present invention, which provide methods of forming dense seed layers and structures thereof. Seed layers comprising a monolayer of atoms having a density of about 0.5 monolayer or greater may be manufactured over a metal layer, resulting in a well defined interface region between the metal layer and a subsequently formed material layer.

In accordance with a preferred embodiment of the present invention, a method of forming a seed layer on a material layer of a semiconductor device includes adsorbing a monolayer of first atoms on the material layer, the first atoms comprising a first density, lowering the temperature of the semiconductor device, and forming thin film of weakly bound physisorbed layers of first molecules over the monolayer. The physisorbed thin film of first molecules is exposed to energy, dissociating a portion of the first molecules in the weakly bound layer proximate to the monolayer of first atoms. The semiconductor device is heated, wherein heating the semiconductor device comprises migrating the dissociated first molecules in the weakly bound layers closest to the first atomic monolayer into the monolayer of first atoms and removing the remainder of the physisorbed weakly bound layer of first molecules. The first atoms of the monolayer comprise a second density after heating the semiconductor device, the second density being greater than the first density, wherein the monolayer of first atoms comprises the seed layer.

In accordance with another preferred embodiment of the present invention, a method of manufacturing a semiconductor device includes providing a workpiece, forming a material layer over the workpiece, and forming a seed layer over the material layer by chemisorption. The seed layer comprises a monolayer of first atoms and a first density. The method includes lowering the temperature of the workpiece, forming a physisorbed layer over the seed layer, the physisorbed layer comprising a weakly bound layer of first molecules, and dissociating a portion of the first molecules in the physisorbed layer, producing atoms from first molecules being proximate the seed layer. The workpiece is heated, causing integration of the atoms from the dissociated first molecules of the physisorbed layer into the seed layer and removing the physisorbed layer. The integration of the atoms from the dissociated first molecules into the seed layer increases the density of the seed layer to a second density, the second density being greater than the first density.

In accordance with another preferred embodiment of the present invention, a semiconductor device includes a workpiece, a first material layer disposed over the workpiece, the first material layer comprising first atoms having a first density, and a seed layer disposed over the first material layer. The seed layer comprises a chemisorbed monolayer of second atoms, the second atoms of the seed layer comprising a second density. The second density is about 0.5 or greater relative to the first density of the first molecules of the first material layer.

Advantages of preferred embodiments of the present invention include providing a thinner interface region between a material layer and a subsequently deposited material layer. The seed layer described herein is very dense and thus provides an improved surface for the formation of a subsequent material layer, resulting in a well-defined, thinner, interface region.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the formation of a monolayer seed layer on a metal layer. The invention may also be applied, however, to the formation of a monolayer seed layer on other material layers, such as semiconductive materials or insulating materials, as examples.

Figure 1:
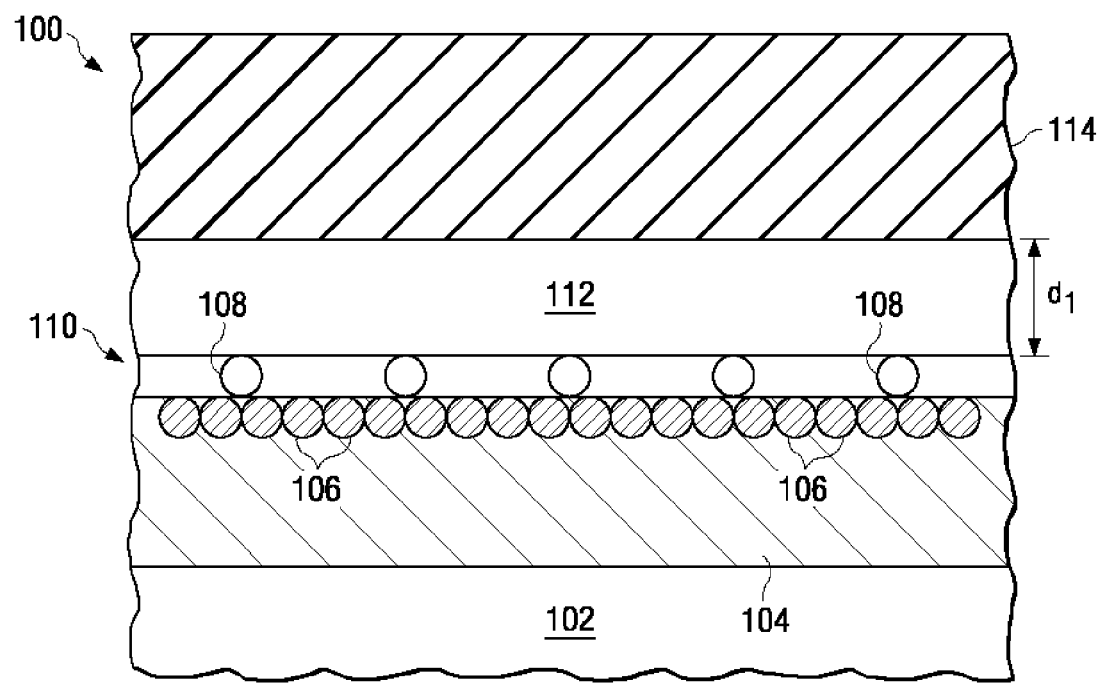
FIG. 1 is a cross-sectional view of a prior art semiconductor device having a monolayer seed layer with a low density, and a thick interface region formed between a metal layer and a subsequently formed material layer.

Prior art methods of forming seed layers result in the formation of low density seed layers, as previously described herein with reference to FIG. 1. The surface coverage of a material layer that can be achieved for chemisorbed atoms, e.g., oxygen or nitrogen, is limited by the adsorption sites on the material that are available to be occupied if adsorption of molecules proceeds by dissociative adsorption of molecules out of the gas phase.

Embodiments of the present invention achieve technical advantages by overcoming this limitation in the number of adsorption sites by implementing process steps that allow for adsorption of additional molecules generated in a physisorbed layer of molecules that is formed on top of the chemisorbed layer. Preferred embodiments of process steps that may be used to generate a chemisorbed monolayer of significantly higher two-dimensional density, e.g., as viewed in a cross-sectional view in FIGS. 6 and 7, than is possible by dissociative adsorption purely out of the gas phase, will next be described. Embodiments of the present invention comprise processes of forming very dense seed layers for thin film growth, which is particularly beneficial for oxidation and nitridation processes; e.g., in the formation of oxide layers, nitride layers, and oxynitride layers.

Figure 2:
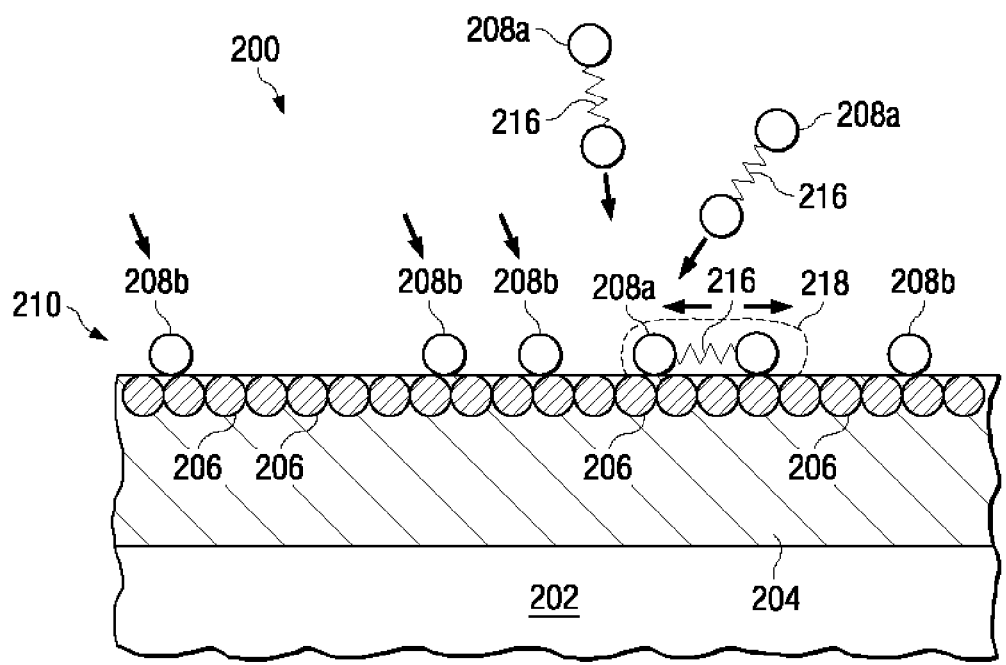
FIGS. 2 through 6 show cross-sectional views of a method of forming a dense monolayer seed layer on a semiconductor device at various stages of manufacturing in accordance with an embodiment of the present invention.

Referring to FIG. 2, a cross-sectional view of a semiconductor device 200 is shown. The semiconductor device 200 includes a workpiece 202. The workpiece 202 may include a semiconductor substrate comprising silicon or other semiconductor materials covered by an insulating layer, for example. The workpiece 202 may also include other active components or circuits formed in a front end of line (FEOL), not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. For example, the workpiece 202 may include component regions or various circuit elements formed therein. The workpiece 202 may include a variety of material layers formed thereon, for example, metal layers, semiconducting layers, dielectric layers, diffusion barrier layers, etc., not shown.

A material layer 204 is formed over the workpiece 202. The material layer 204 may comprise conductive, insulative, or semiconductive materials, for example. In one embodiment of the invention, the material layer 204 preferably comprises a metal. The material layer 204 is also referred to herein as a metal layer 204. The metal layer 204 preferably comprises conductive materials typically used in semiconductor manufacturing, such as copper (Cu), aluminum (Al), refractory metals such as tantalum (Ta), titanium (Ti), tungsten (W), ruthenium (Ru), or molybdenum (Mo), magnetic materials such as niobium (Nb), gadolinium (Gd), dysprosium (Dy), cobalt (Co), or combinations or alloys thereof, as examples, although alternatively, the metal layer 204 may comprise other materials. The metal layer 204 may comprise a thickness of about 100 nm or greater, for example, although alternatively, the metal layer 204 may comprise other dimensions. The metal layer 204 may have been previously patterned using lithography, or the metal layer 204 may be patterned in subsequent manufacturing process steps (not shown).

The metal layer 204 is comprised of a plurality of atoms 206. The atoms 206 at the top surface of the metal layer 204 comprise a first density. The atoms 206 of the metal layer 204 are also referred to herein as first atoms.

The workpiece 202 is exposed to a gas, preferably at room temperature, for example, although alternatively other temperatures may be used. The gas contains a desired elemental species that will be formed on the metal layer 204 as a seed layer. For example, the gas may comprise oxygen, nitrogen, or combinations thereof, as examples, although alternatively, other elements may be used.

The incoming molecules 208a of the gas comprise the atomic species to be adsorbed on the metal layer 204. The atoms of the incoming molecules 208a are bound to one another by a chemical bond 216, as shown. For simple diatomic molecules like oxygen and nitrogen, there is one chemical bond binding two atoms of the same atomic species ($O_2$, $N_2$). The top surface of the metal layer 204 comprises a first number of adsorption sites accessible by dissociative adsorption of the molecules 208a of the gas out of a gas phase. Thus, when introduced to the gas, some of the molecules 208a of the gas are adsorbed on the surface of metal layer 204, where they immediately dissociate and form chemisorbed atoms 208b on the surface of the metal layer 204.

When the molecules 208a reach the top surface of the metal layer 204, dissociative adsorption of some of the molecules 208a occurs, breaking the chemical bond 216 between the two atoms of a molecule 208a, as shown in phantom at region 218, forming chemisorbed atoms 208b that have a strong chemical bond with atoms 206 of the top surface of the metal layer 204. A monolayer of chemisorbed atoms 208b is formed over the metal layer 204. The monolayer of chemisorbed atoms 208b comprises a seed layer 210 having a low density at this point of the manufacturing process, wherein the density is limited by the number of adsorption sites of the top surface of the metal layer 204 that are accessible to the normal process of dissociative adsorption (such as for $O_2$ and $N_2$). The density of the seed layer 210 at this point in the manufacturing process is also referred to herein as a first density.

Thus, the incoming molecules 208a dissociate on the surface of the metal layer 204, and a seed layer 210 comprising a monolayer of chemisorbed atoms 208b is formed. At a certain atomic coverage, in particular, the saturation coverage, additional dissociative adsorption is blocked, because the incoming molecules 208a cannot reach the surface of the metal layer 204 any longer. After the adsorption sites of the top surface of the metal layer 204 are filled, the metal layer 204 top surface is blocked from additional dissociative adsorption by interaction with the previously adsorbed chemisorbed atoms 208b.

After the limited number of atoms 208b are chemisorbed to the metal layer 204 top surface, the temperature of the workpiece 202, and also preferably, the temperature of the gas containing the incoming molecules 208a, is lowered. The temperature is preferably lowered to a temperature lower than a desorption temperature for the seed layer 210 comprising the chemisorbed atoms 208b around the condensation temperature for the gas, in one embodiment. The temperature is preferably lowered to about 31 degrees K or greater for $O_2$ and about 26 K or greater for $N_2$, as examples, although the temperature may also be lowered to other temperatures.

At low temperatures, when the gas containing the molecules is introduced, a thick layer of condensed molecules is adsorbed on top of the chemisorbed layer 210 of molecules, forming a physisorbed layer 220 of physisorbed molecules

Figure 3:
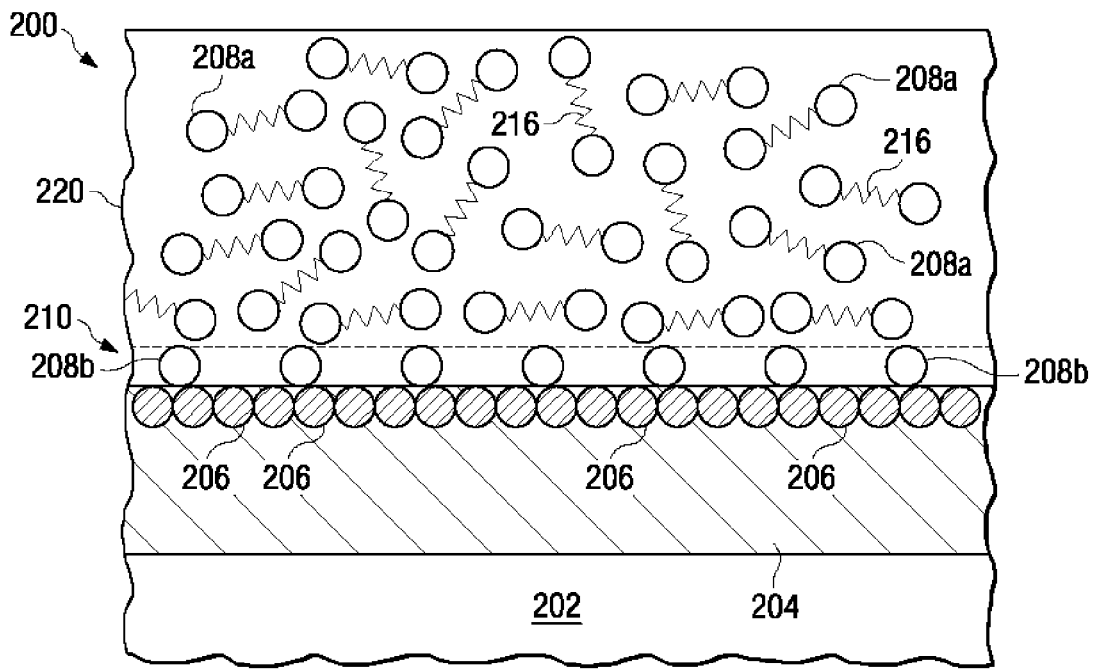
Figure 4:
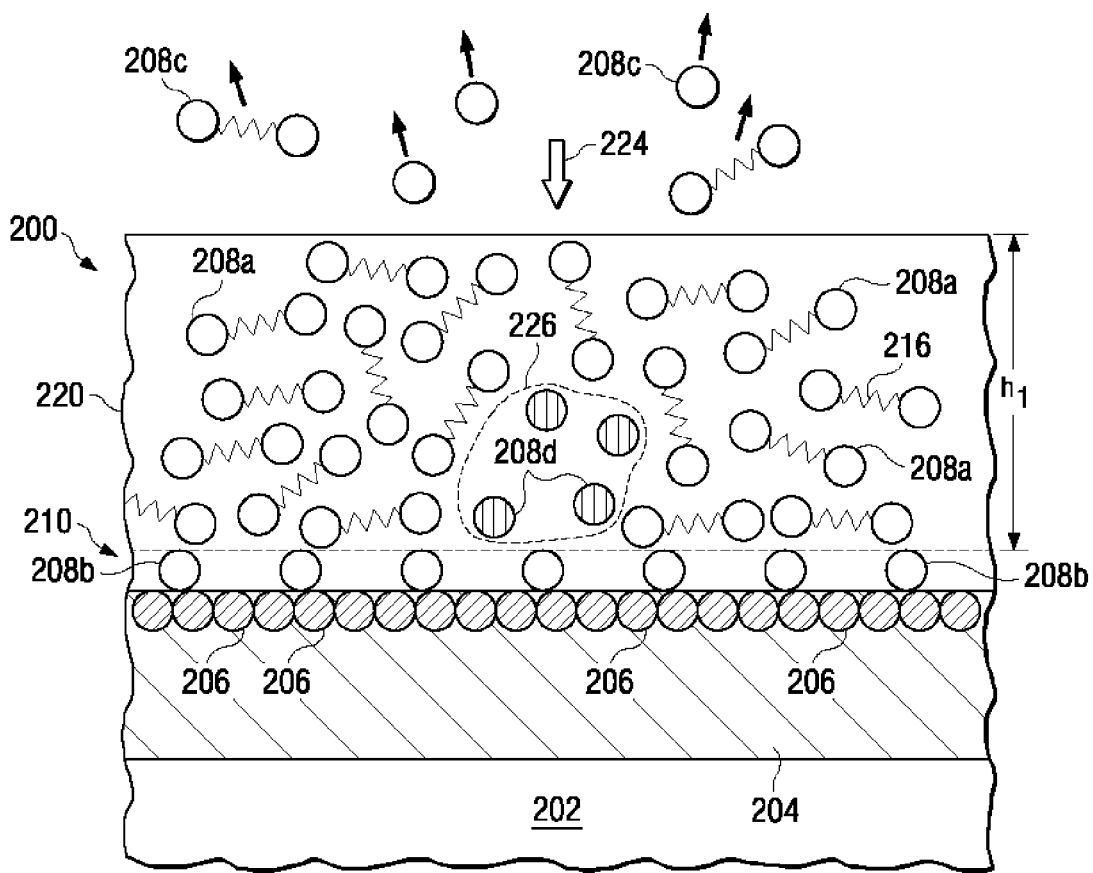
Figure 5:
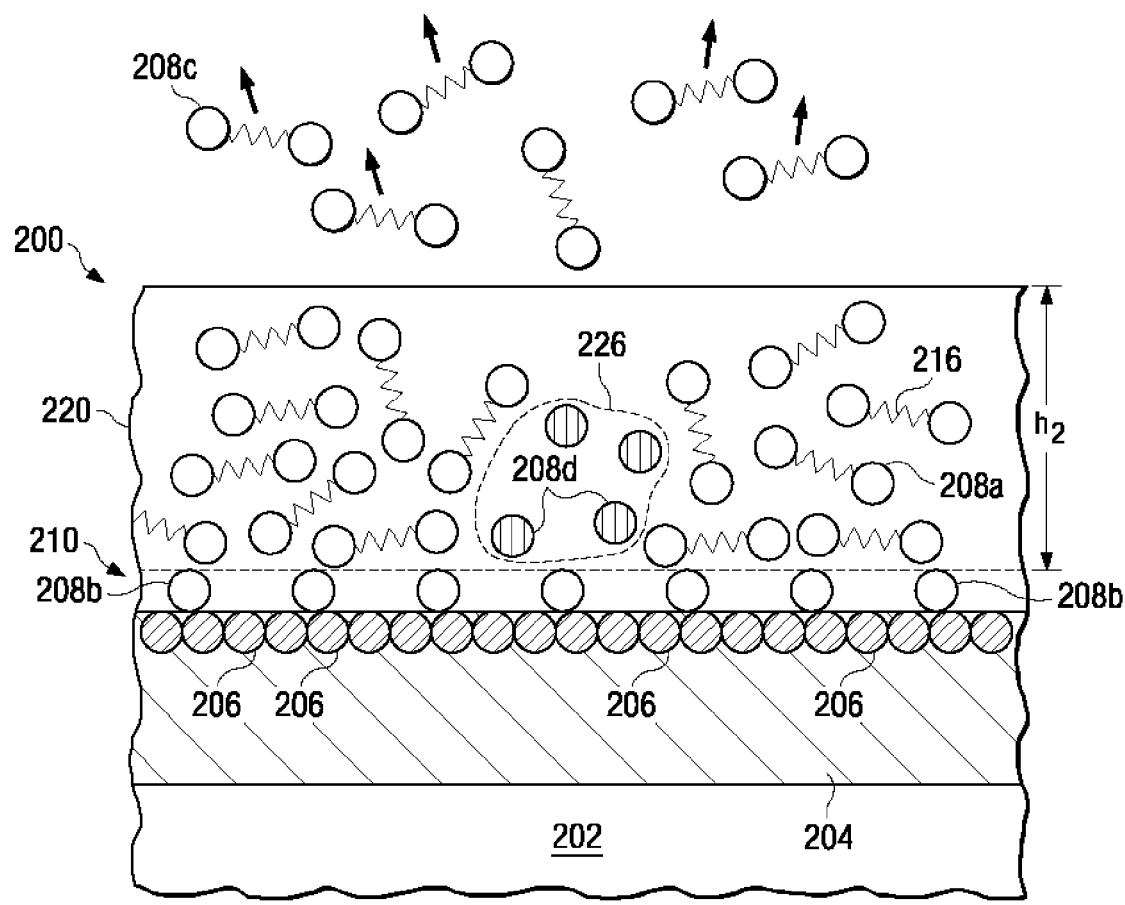

208a, as shown in FIG. 3. Note that the molecules labeled 208a in FIGS. 3, 4 and 5 represent physisorbed molecules, whereas molecules labeled 208a in FIG. 2 present incoming molecules.

In contrast to the strongly bound chemisorbed atoms 208b on the surface of the metal layer 204, the binding forces of the molecules 208a of the physisorbed layer 220 are relatively weak, and typically comprise van der Waals type bonds, for example. The physisorbed layer 220 may comprise a molecular condensate or molecular crystal, for example, in one embodiment. The physisorbed layer 220 preferably comprises multiple layers of monolayers of the physisorbed molecules 208a, and may comprise two or more monolayers of the physisorbed molecules 208a, for example.

In one embodiment, when the temperature of the workpiece 202 is lowered, the temperature of the gas containing the incoming molecules 208a is also lowered. Alternatively, the temperature of the gas may not be increased, for example. The incoming molecules 208a of FIG. 2 have a "sticking" probability of the incoming molecules 208a, i.e., not every molecule 208a of FIG. 2 from the gas phase may adsorb long enough in the molecular precursor state so that there is sufficient time enough to dissociate the molecule 208a and have successful dissociative adsorption. If the incoming gas is cooled, the incoming molecules 208a of FIG. 2 have less energy and are more likely to stay long enough on the surface to dissociate, for example.

Referring again to FIG. 3, in one embodiment, the physisorbed layer 220 comprises about two to five monolayers of physisorbed molecules 208a. In another embodiment, the physisorbed layer 220 comprises about 20 to 30 monolayers of physisorbed molecules 208a, to be described further herein. The physisorbed layer 220 comprises a thickness $h_1$, as shown in FIG. 4.

Next, preferably while the workpiece 202 is kept at the low temperature, a beam of energy 224 is used to irradiate the physisorbed layer 220, to cause dissociation of a portion of the molecules 208a of the physisorbed layer 220, as shown in FIG. 4. The beam of energy 224 preferably comprises energetic particles or radiation, e.g., electrons, ions, neutral particles, or electromagnetic radiation or ultraviolet light, as examples, although alternatively, the energy may comprise other forms of energy that can break molecular bonds in the physisorbed layer 220. A portion of the physisorbed molecules 208a in the physisorbed layer 220 are desorbed, shown at 208c, from the weakly bound physisorbed condensate or molecular crystal 220, simultaneously while molecules 208d within the bulk of the physisorbed layer 220 are dissociated. Some of the dissociated molecules 208d of the physisorbed layer 220 in region 226 at the bottom of the physisorbed layer 220 are close to the top surface of the seed layer 210, as shown. As a portion of the physisorbed molecules 208a are dissociated, forming dissociated molecules 208d within the physisorbed layer 220, a portion of the physisorbed molecules 208a desorbs and leaves the physisorbed layer 220, as shown at 208c, decreasing the thickness of the physisorbed layer 220 to a thickness $h_2$, as shown in FIG. 5, wherein $h_2$ is less than $h_1$, for example.

Figure 6:
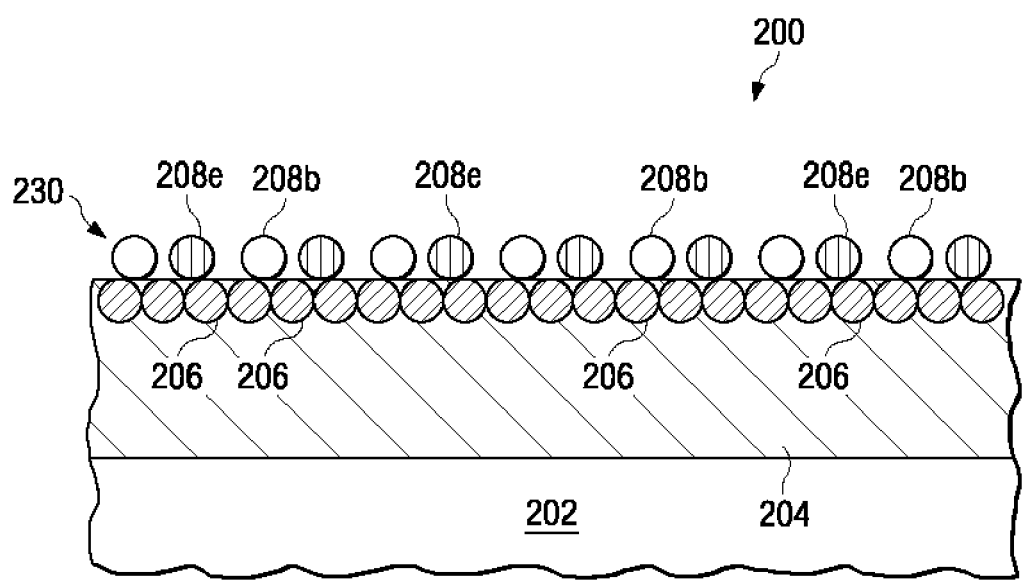

Next, the remaining physisorbed layer 220 is thermally desorbed by heating the workpiece 202, e.g., by returning the workpiece 202 to room temperature, although alternatively, other temperatures may be used. During this process, the atoms of the dissociated molecules 208d generated at the bottom of the physisorbed layer 220 proximate the monolayer seed layer 210 migrate to adsorption sites between the adsorption sites already occupied by the chemisorbed atoms 208b monolayer seed layer 210, as shown in FIG. 6 as chemisorbed atoms 208e. Without the novel processing steps of lowering the temperature, exposing the physisorbed layer 220 to energy that breaks molecular bonds in the physisorbed layer 220, and then raising the temperature of the workpiece 202, the additional adsorption sites adapted to bond to the atoms 208e in the seed layer 230 generated form dissociated molecules 208d would not be accessible for dissociative adsorption out of a gas phase, for example.

Thus, the novel physisorbed layer 220 comprising a solid phase formed adjacent and abutting the seed layer 210 makes additional adsorption sites available in the metal layer 204 for bonding to the atoms 208e in the seed layer 230, resulting in a seed layer 230 with a significantly higher two-dimensional density of atoms 208b and 208e. The resulting seed layer 230 comprises a much more dense chemisorbed monolayer seed layer 230 with adsorption sites occupied by atoms 208e from dissociated molecules 208d from a physisorbed layer 220 comprising a solid phase: adsorption sites that would not have been accessible via dissociative adsorption out of a gas phase.

The seed layer 230 comprises a second density that is greater than the first density of the seed layer 210. The second density of preferably at least two times the first density of the seed layer 210, in one embodiment.

The density of the resulting seed layer 230 is preferably at least 0.5 times the density of the metal layer 204. For example, if the metal layer 204 comprises atoms 206 comprising a first density, and the seed layer 230 comprises atoms 208b and 208e comprising a second density, the seed layer 230 preferably comprises a second density of about 0.5 or greater relative to the first density of the first molecules of the first material layer. In one embodiment, the second density of the atoms 208b and 208e of the seed layer 230 comprises about 0.67 or greater relative to the first density of the atoms 206 of the metal layer 204, as shown in FIG. 6, where there are two atoms 208b and 208e of the monolayer seed layer 230 for every three atoms 206 at the top surface of the metal layer 204, a ratio of 2:3, or a density of about 0.67.

In another embodiment, the metal layer 204 top surface comprises a first number of adsorption sites accessible by dissociative adsorption of molecule 208a out of a gas phase, and the atoms 208b and 208e of the seed layer 230 occupies a second number of adsorption sites of the top surface of the metal layer 204, wherein the second number is greater than the first number. The second number of adsorption sites is at least two times the first number of adsorption sites, in one embodiment.

The novel process of forming a seed layer 230 described herein enables the formation of an atomic species 208e, e.g., atoms 208d from dissociated molecules 208d of the physisorbed layer 220 shown in FIG. 5, close to the surface of the seed layer 210 having a previously fully adsorbed chemisorbed, e.g., atoms 208b of monolayer 210 of the species. The atoms 208d generated by dissociation are entrapped in the physisorbed layer 220, and upon thermal desorption of the physisorbed layer 220, the atoms 208e from the dissociated molecules find their way into adsorption sites in the top surface of the metal layer 204 not accessible to dissociative adsorption out of the gas phase.

Figure 7:
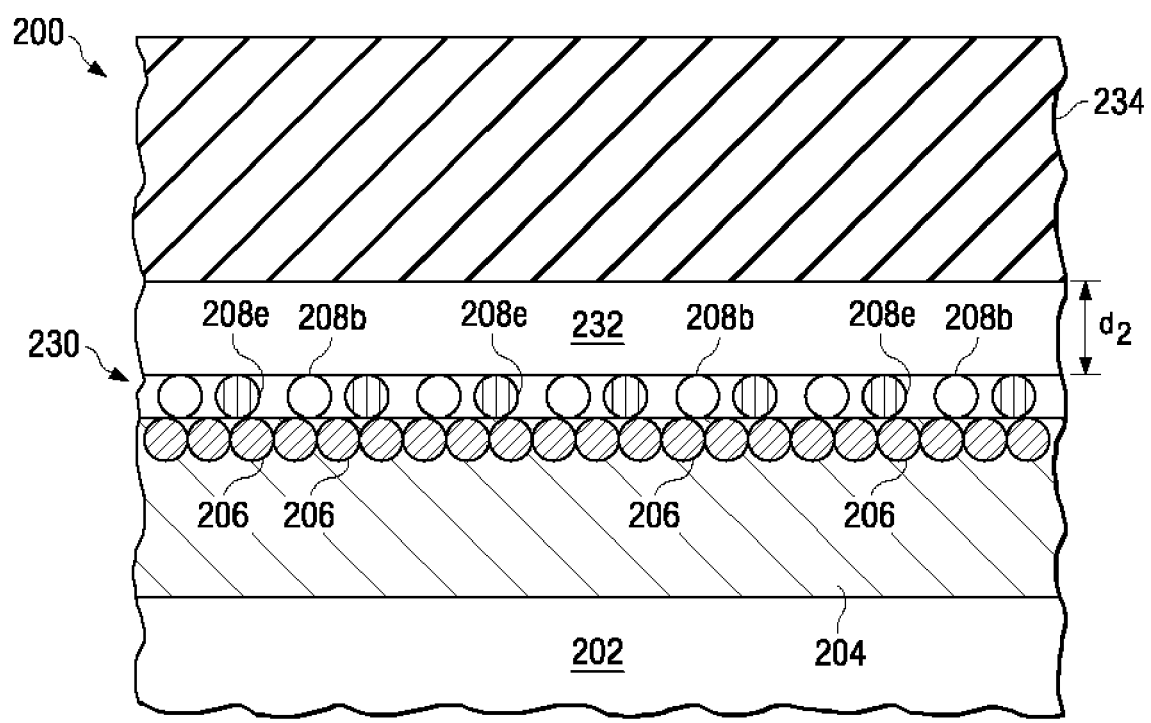
FIG. 7 shows a material layer formed over a metal layer having a dense monolayer seed layer formed thereon in accordance with an embodiment of the present invention, wherein a thinner interface region is formed between the material layer and the metal layer.

A material layer 234 is then formed over the seed layer 230, as shown in FIG. 7. The material layer 234 is also referred to herein as a second material layer 234. The material layer 234 preferably comprises O, N, an O-containing material, or an N-containing material, as examples, although alternatively, the material layer 234 may comprise other materials. The material layer 234 may comprise a thickness of about 100 nm or greater, for example, although alternatively, the material layer 234 may comprise other dimensions. An interface region 232 may be formed between the seed layer 230 and the material layer 234. If present, the interface region 232 is thin, comprising a thickness of a few atomic layers or a few nm or less, for example, and is well defined, e.g., the properties and thickness of the interface region 232 are predictable and repeatable.

In accordance with embodiments of the present invention, the steps of lowering the temperature, forming the physisorbed layer 220, irradiating the physisorbed layer 220 with energy 224, and heating the workpiece 202 to adsorb the atoms 208e from dissociated molecules 208d of the physisorbed layer 220 into the seed layer 230 and remove the physisorbed layer 220, may be repeated several times to obtain the maximum atomic coverage possible of the metal layer 204, i.e., until no more atoms 208e can be chemisorbed on the surface of the metal layer 204, because all possible adsorption sites are occupied. The novel manufacturing process may be repeated two or more times to increase the density of the seed layer 230, while the lateral interaction between neighboring adsorbed atoms 208b and 208e in the seed layer 230 continue to permit further adsorption. The process may be optimized with respect to temperature and the number of times these steps are repeated in order to generate the highest possible coverage and density of the seed layer 230 atoms 208b and 208e.

For example, in one embodiment, preferably the physisorbed layer 220 comprises about 20 to 30 monolayers of the physisorbed molecule 208a. In this embodiment, very low temperatures are needed to generate the condensate. The temperature may need to be lowered to about 31 degrees K or greater for $O_2$ and about 26 K or greater for $N_2$, as examples. Such a thick physisorbed layer 220 is advantageous in that the maximum coverage of chemisorbed atoms 208e within the seed layer 230 may be achieved in one or two process runs, i.e., the steps of lowering the temperature, forming the physisorbed layer 220, irradiating the physisorbed layer 220 with energy 224, and heating the workpiece 202 to adsorb the atoms 208e from dissociated molecules 208d into the seed layer 230 and remove the physisorbed layer 220 may be repeated one or two times in order to achieve the maximum density of the seed layer 230.

In another embodiment, the physisorbed layer 220 is preferably thinner, comprising only about 2 to 3 monolayers of the physisorbed molecules 208a. This is advantageous because the temperature does not have to be lowered as much as when the physisorbed layer 220 is thick. A physisorbed film 220 comprising about 2 to 3 monolayers can be generated at higher temperatures than thick condensate films or molecular crystals, typically at temperature of about 20 to 30 K above the temperatures needed for thick films, for example. However, when the thinner physisorbed layer 220 using the process at a higher temperature with 2 to 3 physisorbed monolayers is formed, the steps of lowering the temperature, forming the physisorbed layer 220, irradiating the physisorbed layer 220 with energy 224, and heating the workpiece 202 to adsorb the atoms 208e from dissociated molecules 208d into the seed layer 230 and remove the physisorbed layer 220 may need to be repeated more often, e.g., two or more times, in order to achieve the maximum possible surface coverage of chemisorbed molecules in the seed layer 230.

Thus, embodiments of the invention achieve technical advantages by forming a weakly bound film of molecules, e.g., the physisorbed layer 220, on top of a chemisorbed layer of the molecules, e.g., the seed layer 210, in order to bring more dissociated molecules close to the surface so that atoms 208d from the dissociated molecules of the physisorbed layer 220 can become chemisorbed atoms 208e on the surface of the material layer 204, within the dense seed layer 230.

In one embodiment, the physisorbed layer 220 may comprise a material having co-adsorbed molecules of the same species as chemisorbed atoms 208b in the seed layer 210. The physisorbed layer 220 may also include molecules of a species different from the chemisorbed atoms 208b in this embodiment. After the manufacturing step shown in FIG. 2, the workpiece 202 is exposed to a rare gas matrix to form the physisorbed layer 220. The molecules of interest, e.g., those molecules of which additional atoms are adsorbed on the metal layer surface 204, may be embedded in the rare gas matrix, for example. Because heavy rare gases like krypton (Kr) or rubidium (Rb), as examples, have a higher condensation temperature than molecular oxygen or nitrogen embedding oxygen and nitrogen, using a rare gas matrix to form the physisorbed layer 220 allows a process of producing a physisorbed layer 220 that brings oxygen and nitrogen close to the metal surface 204 at higher temperatures, for example. Because rare gases only physisorb on a metal surface 204, none of the rare gas atoms compete with thermal desorption of the physisorbed layer 220 for an adsorption site on the metal 204 surface with an oxygen or nitrogen atom produced in this layer.

In one embodiment, after the rare gas matrix is introduced to form the physisorbed layer 220, O or N atoms are implanted into the physisorbed layer 220. The implantation energy is preferably set such that the implanted atoms in the physisorbed layer 220 stop in front of the metal layer 204 top surface. The workpiece 202 is then heated, producing the dense chemisorbed layer 230 comprising atoms 208b and 208e. In this embodiment, preferably the physisorbed layer 220 comprises a thick rare gas layer, e.g., having a thickness of about 100 nm to several 100 nm, although alternatively, the physisorbed layer 220 may comprise other dimensions, because during the implantation process, the thickness of the physisorbed layer 220 will be reduced.

In another embodiment, the molecules of the physisorbed layer 220 may be part of larger molecules, e.g., if the physisorbed layer 220 comprises N, the physisorbed layer 220 may be formed using $NH_3$. The thermal desorption temperatures of the other parts or fragments of the larger molecule may be significantly lower than the desorption temperature of the chemisorbed species to be adsorbed on the metal layer 204 surface, in this embodiment. This would also allow running the processes described herein to produce a dense seed layer at significantly higher temperatures, e.g., at temperatures that are accessible by liquid nitrogen cooling or by cooling using Peltier elements. In the case of oxygen, for example, adsorption of a water layer could be used, by producing ice on the metal layer 204 surface and exposing the ice to radiation that dissociates the water bonds.

In another embodiment, the atoms 208b in the seed layer 210 may be different from the atoms 208e in the seed layer. For example, the atoms 208b may comprise oxygen atoms and the atoms 208e may comprise nitrogen atoms which can be produced by the method described above using physisorption of a nitrogen film, or nitrogen embedded in a rare gas matrix or a $NH_3$ film, as examples. Alternatively, the atoms 208b may comprise nitrogen atoms and the atoms 208e may comprise oxygen atoms, for example. This embodiment results in a seed layer 230 adapted to be an excellent seed layer for a second material layer 234 comprising an oxynitride film, for example.

Advantages of embodiments of the invention include providing a thinner, well defined interface region 232, e.g., having a dimension $d_2$, wherein $d_2$ is thinner than $d_1$ of FIG. 1, between a material layer 204 and a subsequently deposited material layer 234. The seed layers 230 described herein are very dense and thus provide an improved surface for the formation of a subsequent material layer 234, resulting in a well-defined interface region 232.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece;
   a first material layer disposed over the workpiece, the first material layer comprising a first number of atoms at a surface; and
   a seed layer disposed over the first material layer, the seed layer comprising a chemisorbed monolayer of a second number of atoms at the surface having a surface coverage of at least 0.5 such that the ratio of the number of first atoms at the surface to the number of second atoms at the surface is no more than 2:1, wherein the second atoms of the seed layer comprise oxygen.

2. The semiconductor device according to claim 1, wherein the first material layer comprises a metal layer having a top surface, the top surface of the metal layer comprising a first number of adsorption sites accessible by dissociative adsorption of the second atoms of the seed layer out of a gas phase, wherein the second atoms of the seed layer occupy a second number of adsorption sites of the top surface of the metal layer, the second number being greater than the first number.

3. The semiconductor device according to claim 2, wherein the second number of adsorption sites is at least two times the first number of adsorption sites.

4. The semiconductor device according to claim 1, wherein the saturation coverage at the surface is about 0.67 or greater.

5. The semiconductor device according to claim 1, further comprising a second material layer disposed over the seed layer.

6. The semiconductor device according to claim 5, wherein the second material layer comprises oxygen.

7. The semiconductor device according to claim 5, wherein the first material layer comprises Cu, Al, Ta, Ti, W, Ru, Mo, Nb, Gd, Dy, Co, Mn, combinations, or alloys thereof, and wherein the second material layer comprises O, N, an O-containing material, or an N-containing material.

8. The semiconductor device according to claim 5, further comprising an interface region disposed between the seed layer and the second material layer, the interface region comprising a thickness of about 100 nm or less.

9. The semiconductor device according to claim 1, wherein the second atoms of the seed layer comprise a combination of nitrogen and oxygen.

10. The semiconductor device according to claim 5, wherein the second material layer comprises nitrogen.

11. The semiconductor device according to claim 5, wherein the second material layer comprises a combination of nitrogen and oxygen.

* * * * *